(12) United States Patent
Krzeczowski (10) Patent No.: US 7,525,090 B1
(45) Date of Patent: Apr. 28, 2009

(54) DYNAMIC CENTERING FOR BEHIND-THE-LENS DARK FIELD IMAGING

(75) Inventor: Kenneth J. Krzeczowski, Scotts Valley, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 256 days.

(21) Appl. No.: 11/725,022

(22) Filed: Mar. 16, 2007

(51) Int. Cl.
*G01N 23/00* (2006.01)

(52) U.S. Cl. ............... 250/307; 250/306; 250/310; 250/311

(58) Field of Classification Search ......... 250/306, 250/307, 310, 311, 397
See application file for complete search history.

(56) References Cited

U.S. PATENT DOCUMENTS

| | | |
|---|---|---|
| 5,424,541 A | 6/1995 | Todokoro et al. |
| 5,644,132 A | 7/1997 | Litman et al. |
| 6,407,373 B1 | 6/2002 | Dotan |
| 6,667,476 B2 | 12/2003 | Todokoro et al. |
| 6,872,944 B2 | 3/2005 | Todokoro et al. |
| 6,885,001 B2 | 4/2005 | Ose et al. |
| 7,141,791 B2 * | 11/2006 | Masnaghetti et al. ........ 250/311 |

* cited by examiner

*Primary Examiner*—Jack I Berman
*Assistant Examiner*—Michael Maskell
(74) *Attorney, Agent, or Firm*—Okamoto & Benedicto LLP (57) ABSTRACT

One embodiment relates to a method of behind-the-lens darkfield imaging using a scanning electron microscope apparatus. An incident beam is focused onto a specimen surface using an immersion objective lens, and the incident beam is deflected so as to scan the incident electron beam over a field of view of the specimen surface. A secondary electron beam is detected using a segmented detector to obtain a set of pixel data for each segment of the detector. Scan-dependent movement of the secondary electron beam over the segmented detector is compensated for by processing using a dynamic centering algorithm to generate a set of virtual pixel data for each segment of a virtual detector. At least one set of the virtual pixel data is used to generate a dark field image. Other embodiments, aspects, and features are also disclosed.

14 Claims, 14 Drawing Sheets

FIG. 1A
(Conventional)

Side 1

Center

FIG. 2B

FIG. 3A 64 channels grouped into 10 sections

FIG. 3B

MA Detector 502

DYNAMIC CENTERING FOR BEHIND-THE-LENS DARK FIELD IMAGING

BACKGROUND OF THE INVENTION

1. Technical Field

The present disclosure relates to apparatus and methods for imaging using a scanning electron beam. More particularly, the present disclosure relates to dark field imaging using a scanning electron beam.

2. Description of the Background Art

The two most common types of electron microscopes available commercially are the scanning electron microscope (SEM) and the transmission electron microscope (TEM). In an SEM, the specimen is scanned with a focused beam of electrons which produce secondary and/or backscattered electrons as the beam hits the specimen. These are detected and typically converted into an image of the surface of the specimen. Specimens in a TEM are examined by passing the electron beam through them, revealing more information of the internal structure of specimens.

Bright field imaging and dark field imaging are often used in the context of TEMs. A bright field image may be formed in a TEM by selecting electrons from a central diffraction spot to form the image. A dark field image may be formed in a TEM by selecting some or all of the (non-central) diffracted electrons to form the image. The selection of electrons may be implemented using an aperture into the back focal plane of the objective lens, thus blocking out most of the diffraction pattern except that which is visible through the aperture. Dark field imaging is typically less commonly used in SEMs than in TEMs.

It is desirable to improve electron beam instrumentation for bright field and dark field electron imaging.

SUMMARY

One embodiment relates to a method of behind-the-lens dark-field imaging using a scanning electron microscope apparatus. An incident beam is focused onto a specimen surface using an immersion objective lens, and the incident beam is deflected so as to scan the incident electron beam over a field of view of the specimen surface. A secondary electron beam is detected using a segmented detector to obtain a set of pixel data for each segment of the detector. Scan-dependent movement of the secondary electron beam over the segmented detector is compensated for by processing using a dynamic centering algorithm to generate a set of virtual pixel data for each segment of a virtual detector. At least one set of the virtual pixel data is used to generate a dark field image.

Another embodiment relates to a method of compensating for scan-dependent movement of a secondary electron beam over a segmented detector. An electron distribution is estimated for the secondary electron beam. A calibrated movement of the electron distribution is used to determine positioning of a virtual segmented detector in relation to the electron distribution. The electron distribution is integrated over segments of the virtual detector to calculate a virtual pixel value for each segment of the virtual detector.

Another embodiment relates to a scanning electron beam apparatus with behind-the-lens dark-field imaging. An immersion objective lens is configured to focus the incident electron beam onto a specimen surface, and a beam deflector configured to controllably scan an incident electron beam over a field of view of the specimen surface. A segmented detector is configured behind the objective lens and is further configured detect a secondary electron beam emitted from the specimen surface such that a set of pixel data is obtained from each segment of the detector. Finally, a data processing system is configured to compensate for scan-dependent movement of the secondary electron beam over the segmented detector by processing using a dynamic centering algorithm to generate a set of virtual pixel data for each segment of a virtual detector and is further configured to generate a dark field image using at least one set of the virtual pixel data.

Other embodiments, aspects, and features are also disclosed.

DETAILED DESCRIPTION

Figure 1A:
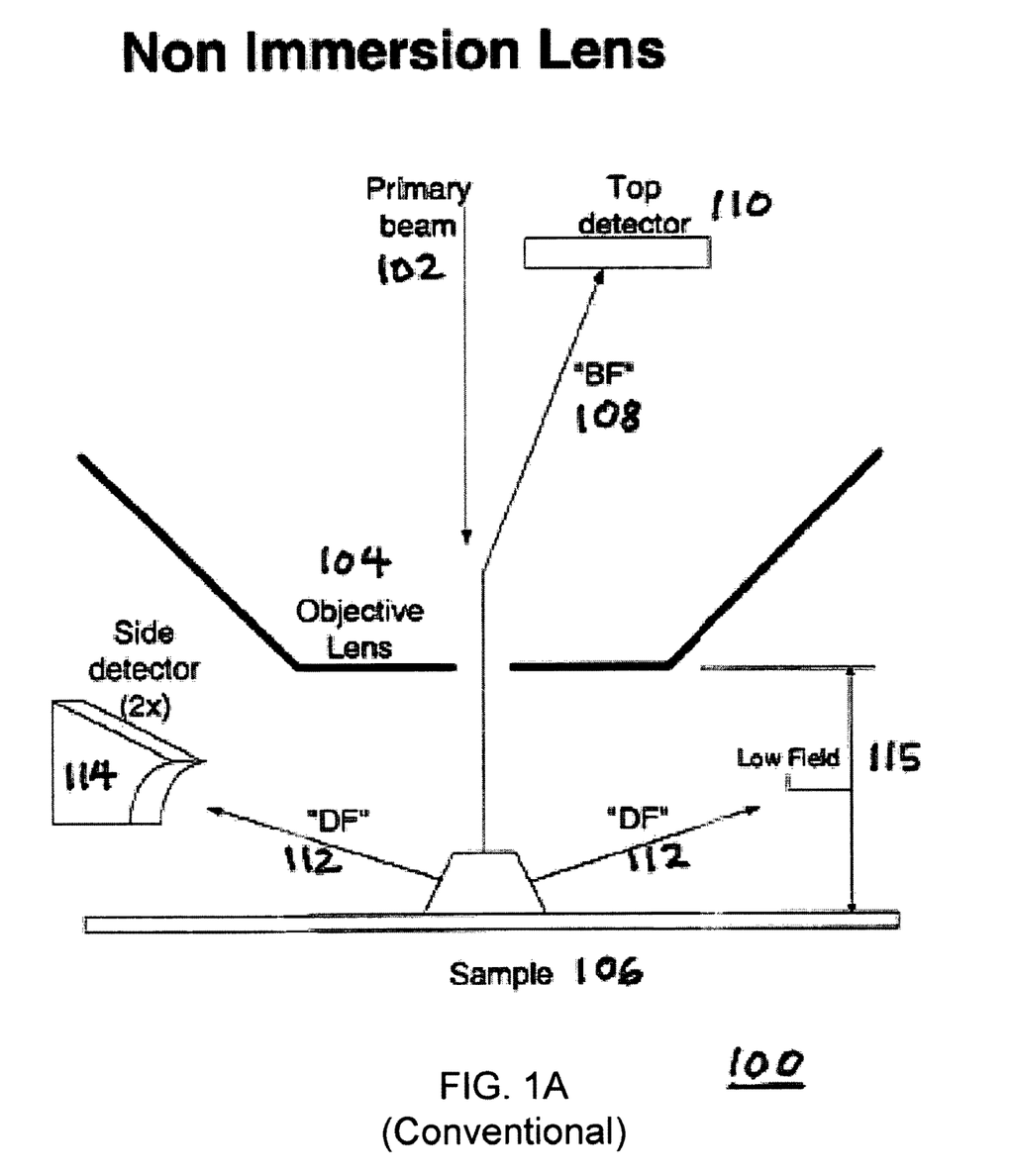
FIG. 1A depicts select elements of a conventional SEM dark field detection system with a non-immersion lens configuration.

Select elements of a conventional SEM dark field detection system with a non-immersion lens configuration 100 are depicted in FIG. 1A. Other elements, such as, an electron beam source, a Wien filter, and so forth, are not as pertinent to this discussion and are not depicted for purposes of clarity.

In FIG. 1A, the primary electron beam 102 is shown as it is directed along the optical axis of the electron beam column. The objective lens 104 in this case is a non-immersion lens. A non-immersion lens 104 does not immerse the area between itself and the sample 106 in a high magnetic field. Instead, only a relatively low magnetic field 115 is present between the objective lens 104 and the sample 106.

In this configuration 100, the bright field ("BF") electrons 108 are detected by a top detector 110, and the dark field ("DF") electrons 112 are detected by side detectors 114. In one particular implementation, two side detectors 114 may be utilized. This dark field configuration may be referred to as "below-the-lens" dark field because the DF detectors 114 are positioned below the objective lens 104.

This "below-the-lens" dark field imaging using a non-immersion lens 104 has certain limitations and disadvantages. First, the lens aberration coefficients of non-immersion lenses are typically higher than those of immersion lenses. This leads to inferior resolution of the imaging. In addition, the polar angle discrimination threshold is not well controlled for such below-the-lens detectors 114 because the electron energy and emission azimuth can affect the polar angle acceptance of the detector.

Attempts have been previously made to provide a dark field detection system for an SEM with an immersion objective lens. Using an immersion objective lens has the advantage of potentially providing higher resolution. Unfortunately, immersion objective lens technology generally interferes with the collection efficiency of below-the-lens detectors 114. The interference occurs is because of the high magnetic field between the immersion objective lens and the sample. Hence, non-immersion objective lens designs have been typically used, resulting in higher lens aberration coefficients and leading to inferior image resolution.

I. Behind-the-Lens Dark Field Detection with Segmented Detector

Figure 1B:
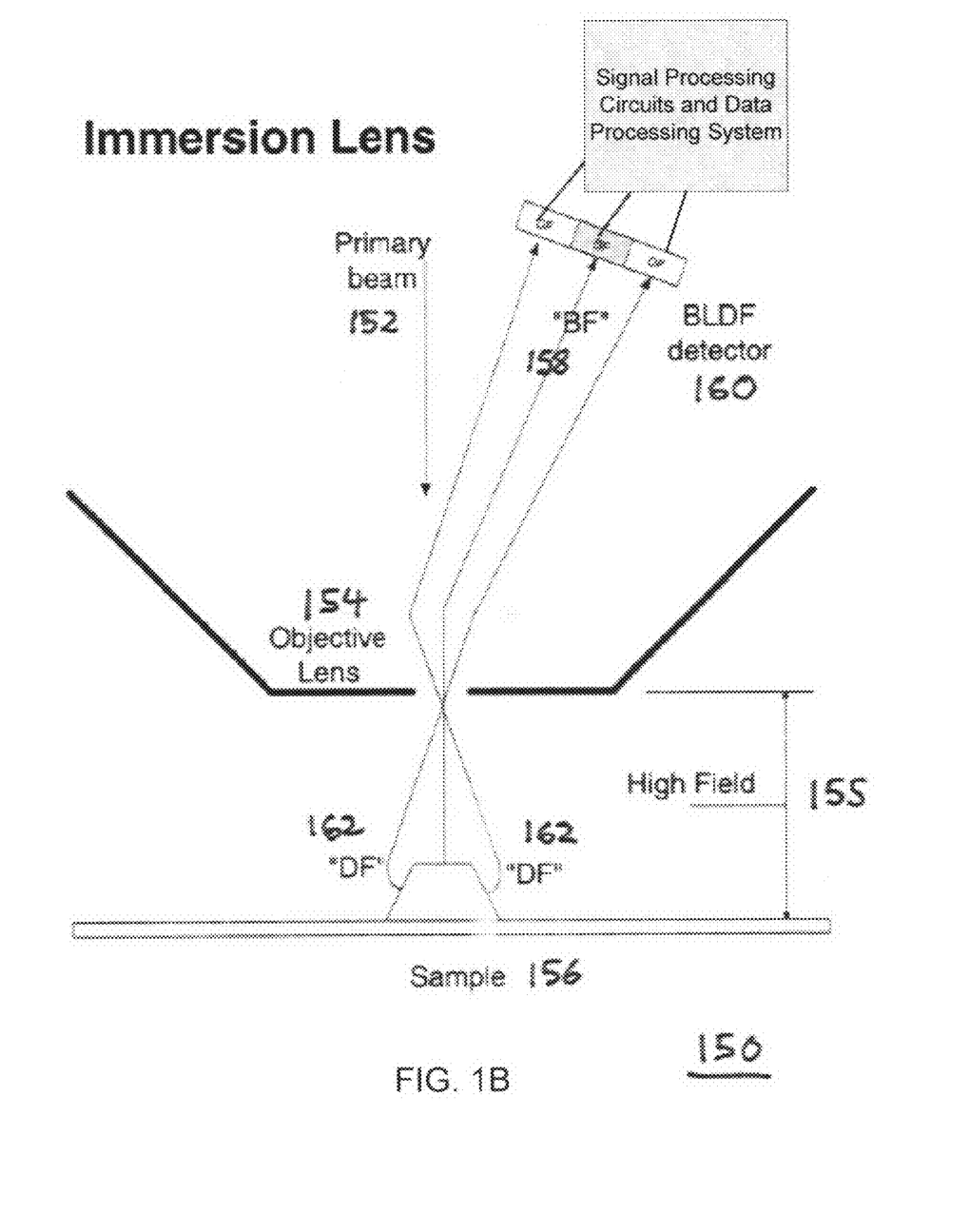
FIG. 1B depicts select elements of an SEM dark field detection system with an immersion lens configuration in accordance with an embodiment of the invention.

Select elements of an SEM dark field detection system with an immersion lens configuration 150 are depicted in FIG. 1B. Other elements, such as, an electron beam source, a Wien filter, and so forth, are not as pertinent to this discussion and are not depicted for purposes of clarity.

In FIG. 1B, the primary electron beam 152 is shown as it is directed along the optical axis of the electron beam column. The objective lens 154 in this case is an immersion objective lens. An immersion objective lens 154 immerses the area between itself and the sample 156 in a relatively high magnetic field 155.

In this configuration 150, the bright field ("BF") electrons 158 and the dark field ("DF") electrons 162 are both detected by a top detector 160. The detector 160 is positioned behind the objective lens and may be referred to as a "behind-the-lens-dark-field" (BLDF) detector. The BLDF detector 160 may be implemented as a segmented detector so as to individually or separately detect electrons arriving at different regions of the detector. The pixel signals obtained from each of the segments may be processed using signal processing circuitry and a data processing system.

This "behind-the-lens" dark field imaging using an immersion lens 154 has certain advantages, and also certain difficulties. Advantageously, the lens aberration coefficients of immersion lenses are typically lower than those of non-immersion lenses. This leads to superior resolution of the imaging. In addition, the polar angle discrimination threshold may be better controlled for such below-the-lens detectors.

One particular difficulty of "behind-the-lens" dark field imaging using a scanning electron microscope has been observed by the applicant. Namely, applicant has observed that the behind-the-lens SEM configuration suffers from non-uniformity performance problems due to the secondary electron beam (158 and 162) moving on the top detector 160 depending on the scanning movement of the primary beam 152.

Figure 2A:
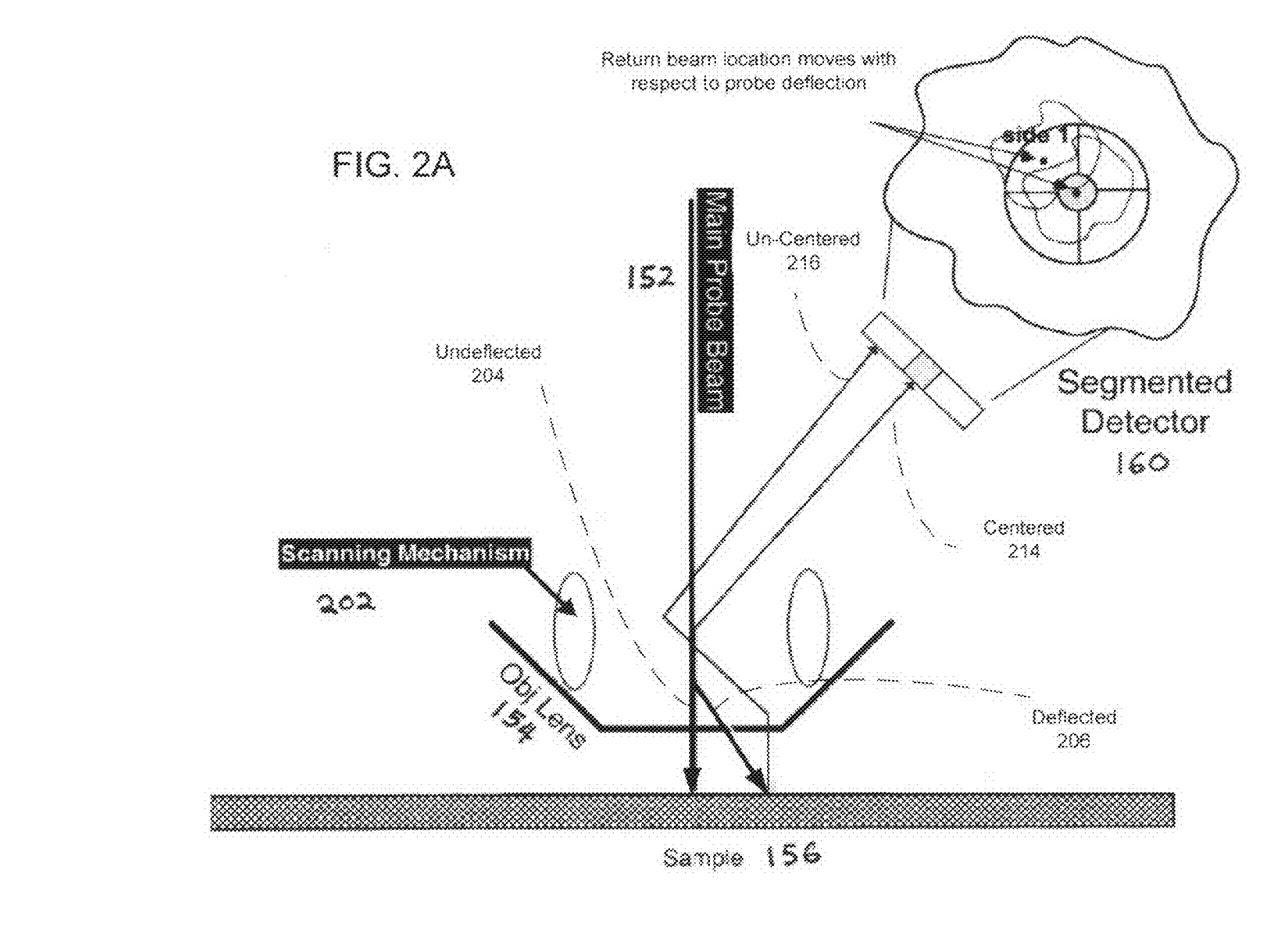
FIG. 2A shows a scanning mechanism in the behind-the-lens SEM configuration in accordance with an embodiment of the invention.

FIG. 2A shows a scanning mechanism (deflector) 202 in the behind-the-lens SEM configuration. The scanning mechanism 202 may be, for example, a controllable electrostatic deflector. The scanning mechanism 202 controllably deflects the primary incident electron beam 152 such that it is scanned over a field of view covering an area of the specimen surface.

Shown (not to scale) are an "undeflected" position 204 of the primary beam 152 and a "deflected" position 206 of the primary beam 152, for purposes of discussion. As seen, when the primary beam 152 is in the undeflected position 204 the resulting secondary beam may be, for example, at a centered position 154 at the top detector 160. However, in this example, when the primary beam 152 is in the deflected position 206 the resulting secondary beam is at an un-centered position 156 at the top detector 160. In other words, the return (secondary) beam moves with respect to the probe (primary) beam deflection.

Figure 2B:
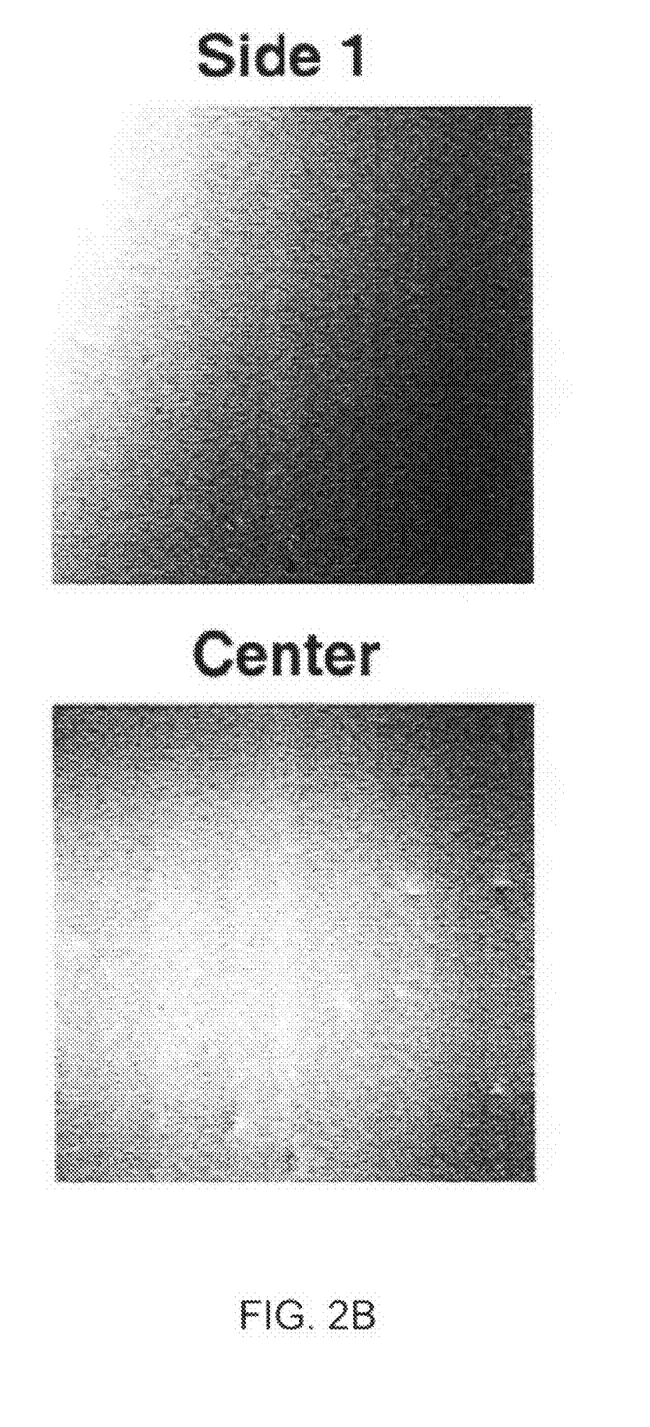
FIG. 2B provides example electron micrographs (images) showing non-uniformities which applicant believes are caused by scan-dependent movement of the secondary electron beam.

As further illustrated in FIG. 2A, the distribution of the detected electrons may be centered upon the center portion of the segmented detector 160 for one deflection condition of the primary beam 152, and the distribution of the detected electrons may be centered upon a "side 1" segment of the segmented detector 160 for another deflection condition of the primary beam 152. Example electron micrographs resulting from such conditions are shown in FIG. 2B. The bottom electron micrograph shows an image of an area made of pixels detected by the center segment ("Center") of a segmented detector 160, while the top electron micrograph shows an image of an area made of pixels detected by one of the side segments ("Side 1") of a segmented detector 160. One can see in the bottom image (from the Center segment) that the illumination appears non-uniform. In particular, the corner regions of the image are darker than the middle region of the image. One can further see from the top image (from the Side 1 segment) that the illumination also appears very non-uniform. In this case, the upper left corner of the image appears much brighter than the rest of the image. Applicant believes that this apparent non-uniformity in the illumination is due to the aforementioned movement of the secondary beam which is dependent on the deflection of the primary beam.

Figure 3A:
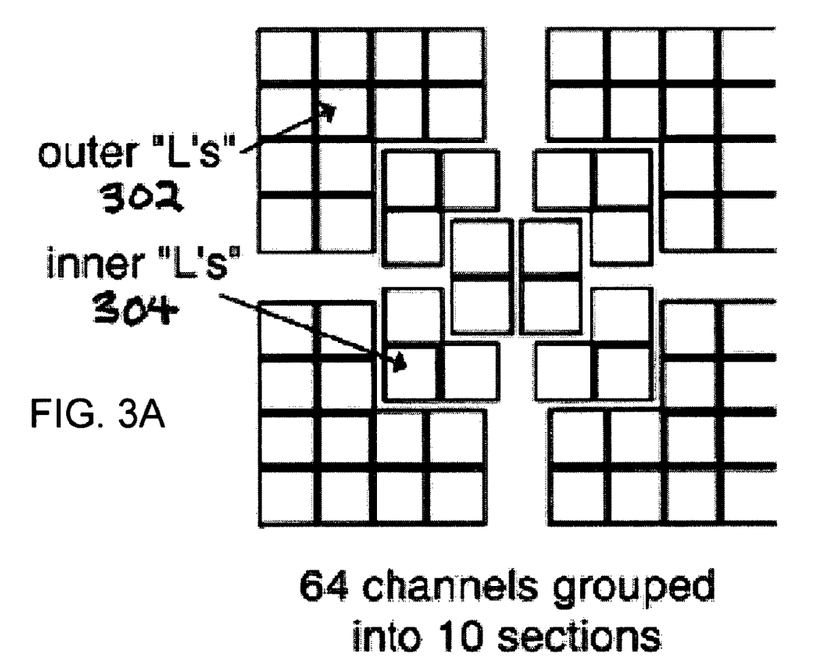
FIG. 3A is a schematic diagram showing an implementation of a segmented detector in accordance with an embodiment of the invention.

FIG. 3A is a schematic diagram showing an implementation of a segmented detector in accordance with an embodiment of the invention. This detector includes 64 channels grouped into 10 sections (i.e. into 10 segments). There are four outer L sections (12 channels each) 302, four inner L sections (three channels each) 304, and two center sections (two channels each).

Figure 3B:
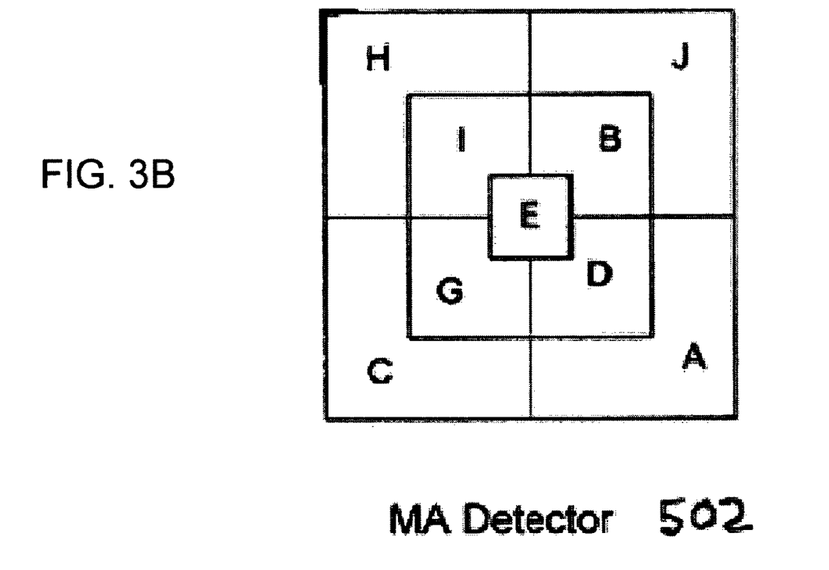
FIG. 3B shows various segments for a multi-anode detector in accordance with an embodiment of the invention.
Figure 4:
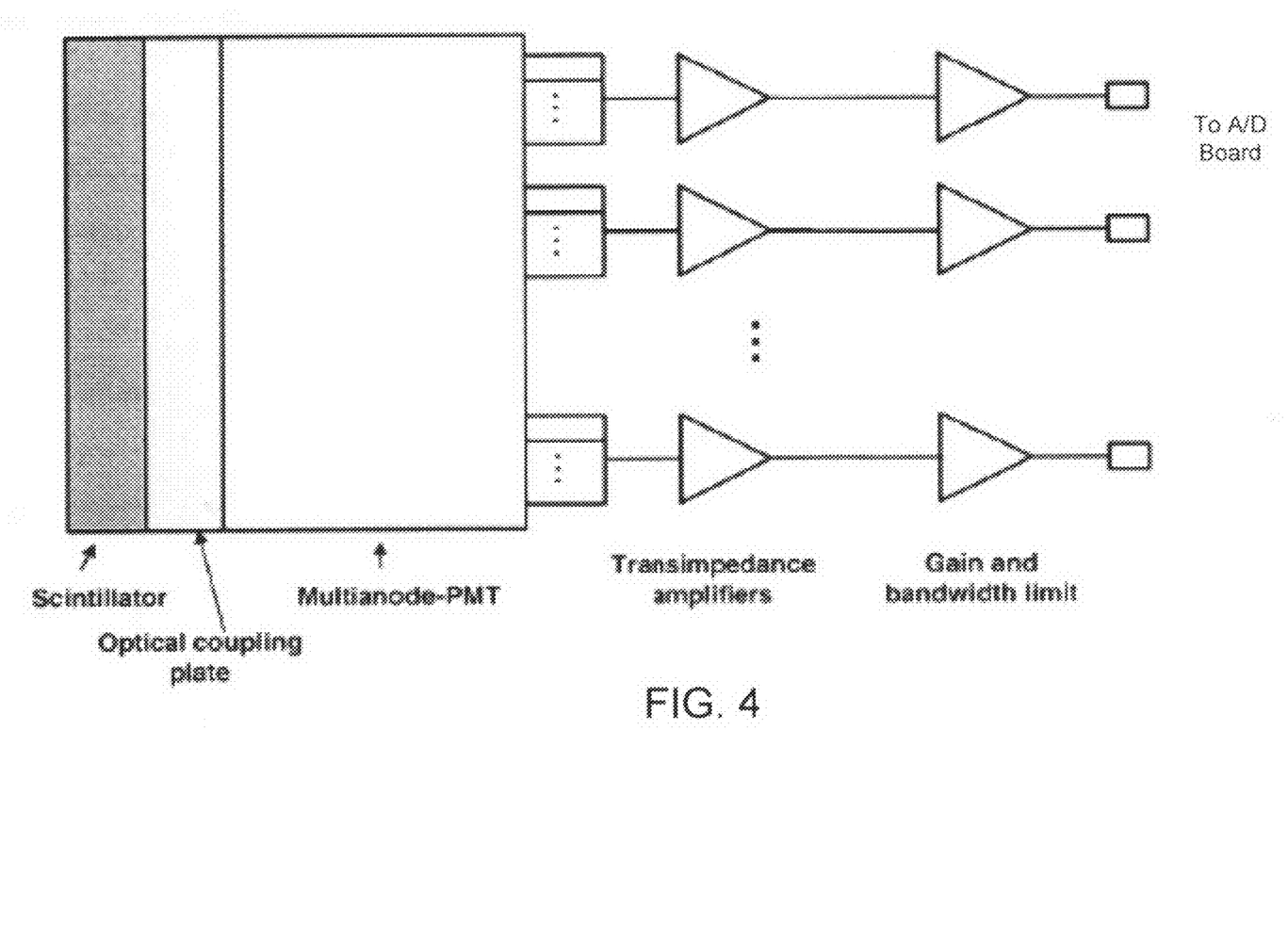
FIG. 4 depicts components of a multi-anode detector.

FIG. 3B shows the four outer L segments (A, C, H, J), the four inner L segments (B, D, G, I) and a single center segment (E) (grouping together the two center sections from FIG. 3A). The detector in FIG. 3B may be referred to as a multi-anode (MA) detector 502. Components of such a detector are depicted in FIG. 4. The illustrated components include, for example, a scintillator, optical coupling plate, multi-anode photo-multiplier tube, transimpedance amplifiers, and gain and bandwidth limiters.

Figure 5:
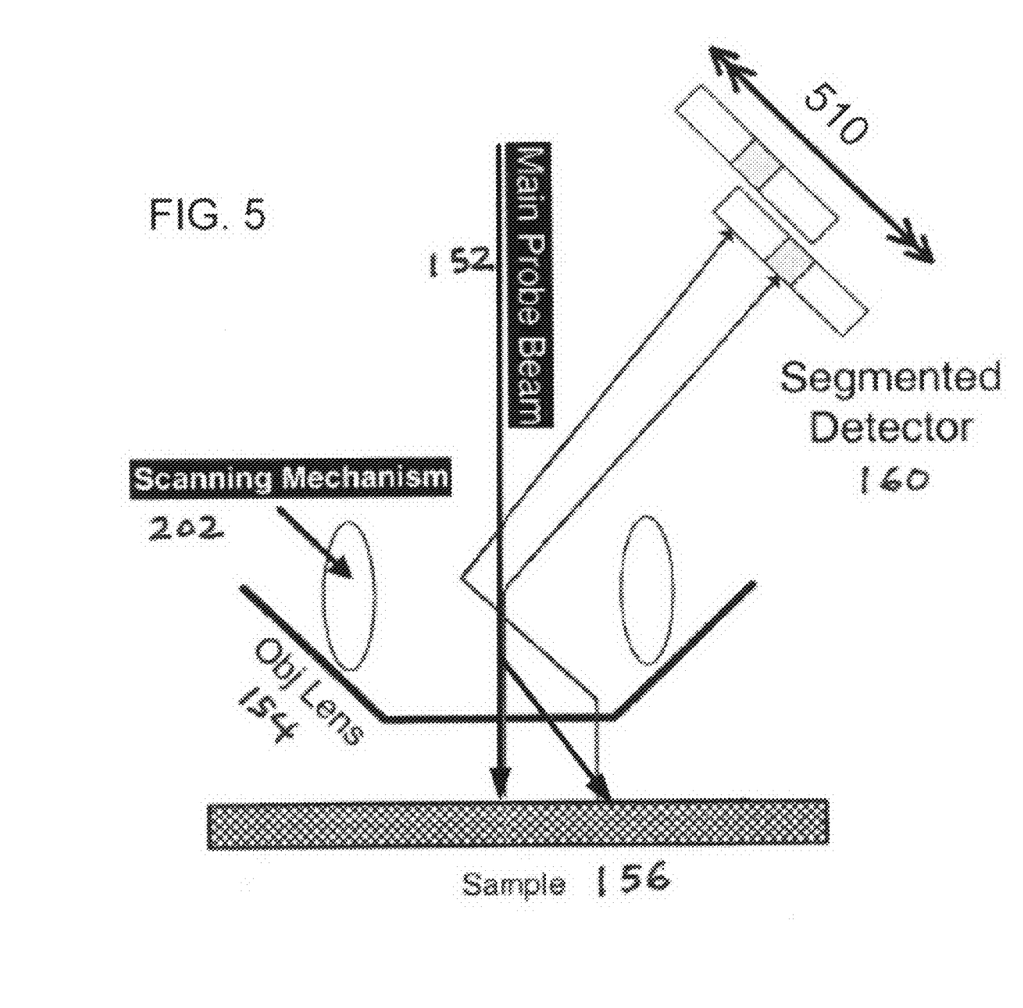
FIG. 5 is a schematic diagram of a hypothetical solution to the scan-dependent movement problem.

FIG. 5 is a schematic diagram of a hypothetical solution to the above-mentioned problem of movement of the secondary electron beam. As discussed above in relation to FIG. 2A, applicant has observed that the secondary electron beam moves in dependence upon the primary beam scanning. Hence, in theory, a mechanical solution may be implemented, where the segmented detector is physically moved in correspondence with the movement of the secondary electron beam. This would, of course, require movement of the detector in correspondence with the relatively rapid rastering of the primary beam across the field of view. Hence, it is believed that such a mechanical solution would be problematic.

We now discuss a technique for dynamic centering for behind-the-lens darkfield imaging on a scanning electron microscope in accordance with an embodiment of the invention.

Figure 6:
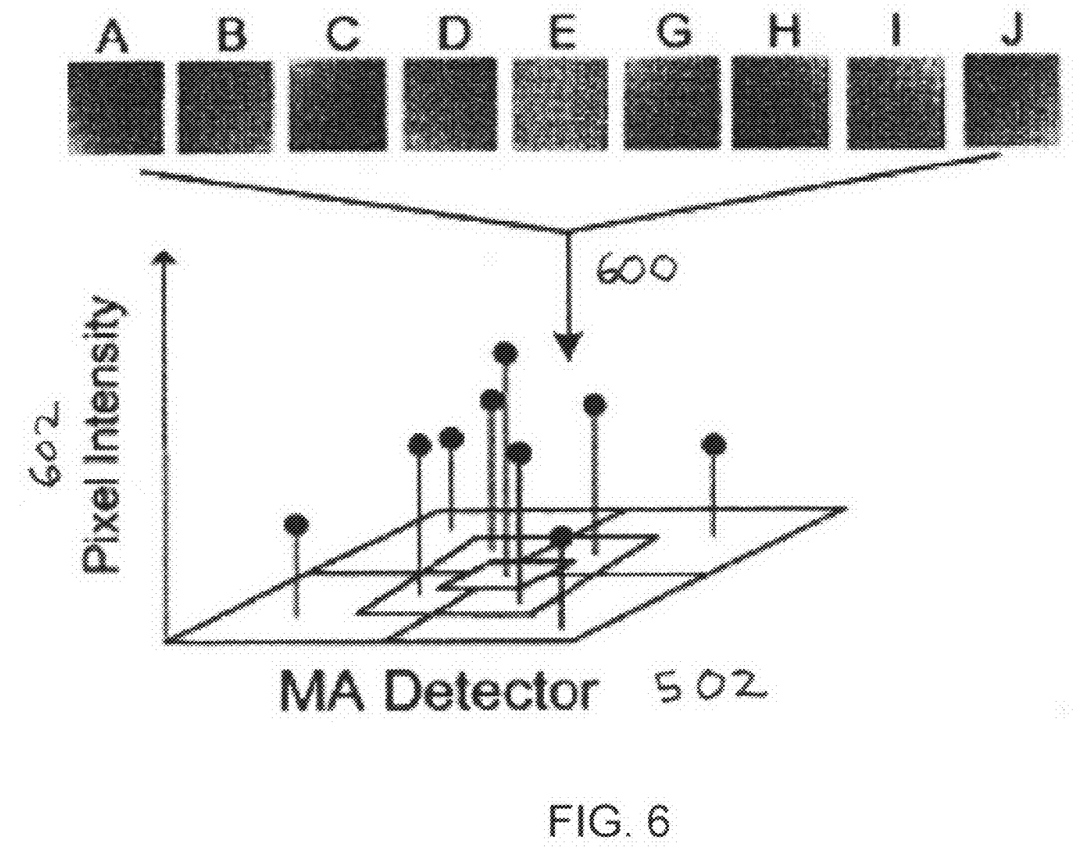
FIG. 6 is a schematic diagram showing a step of imaging a sample of interest using a segmented detector in accordance with an embodiment of the invention.

FIG. 6 is a schematic diagram illustrating a step 600 of imaging a sample of interest using a segmented detector in accordance with an embodiment of the invention. Here, the segments of the detector are those discussed above in relation to FIG. 3B. As shown, the multi-anode (MA) detector 502 may be used to detect or measure a different pixel intensity 602 at each segment. Hence, in this embodiment, as the primary beam is scanned over the field of view (FOV), pixel data for nine separate images is obtained from the MA detector 502. Each of the nine images corresponds to the pixel intensity data measured by one of the nine segments of the detector.

Figure 7A:
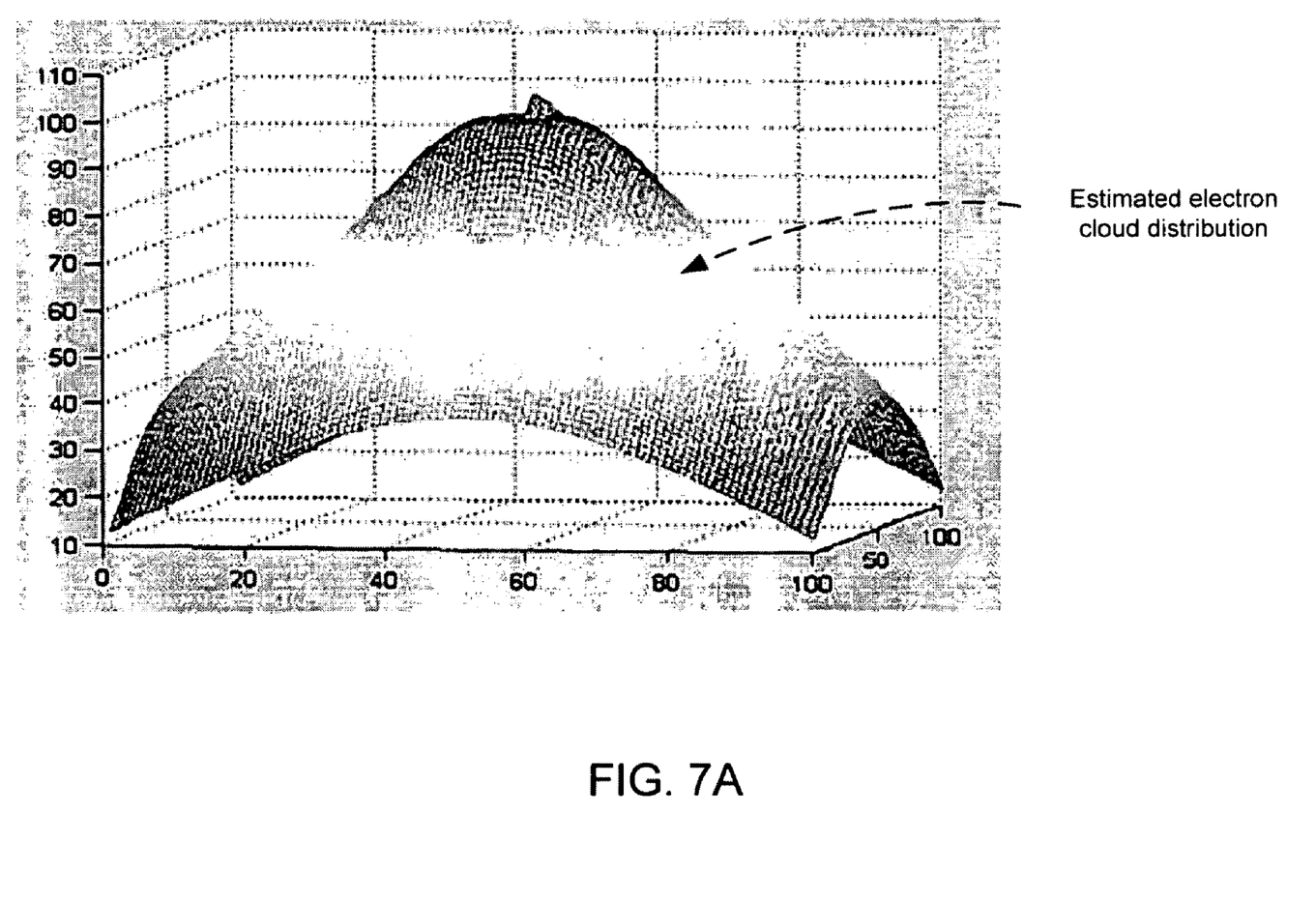
FIG. 7A is a schematic diagram illustrating an estimated electron distribution in accordance with an embodiment of the invention.

FIG. 7A is a schematic diagram illustrating an estimated electron cloud distribution in accordance with an embodiment of the invention. The electron distribution may be estimated using various techniques. For example, assumptions may be made that a blank wafer forms a cloud with a Gaussian distribution, and that the distribution is constant with a same set of beam conditions.

Figure 7B:
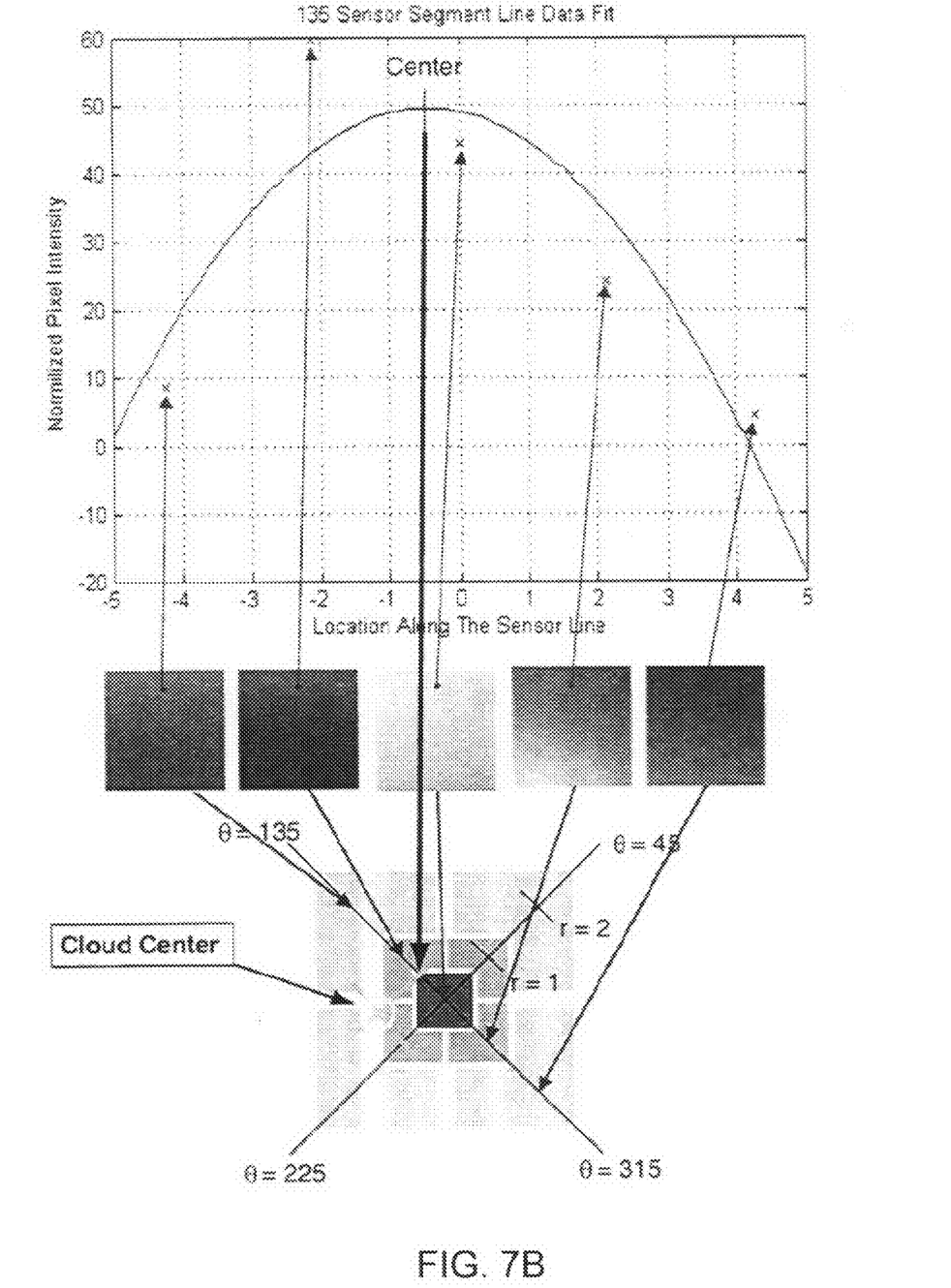
FIG. 7B is a schematic diagram illustrating a technique for calculating the secondary beam center for a single pixel in the FOV in accordance with an embodiment of the invention.

FIG. 7B is a schematic diagram illustrating a technique for calculating the secondary beam center for a single pixel in the FOV (for purposes of the calibration of the electron cloud movement) in accordance with an embodiment of the invention. In the technique, the center of the secondary beam may be found by finding a center of the detected intensity along each of two axes (one at 45 degrees, another at 135 degrees). These two axes are shown in the diagram on the bottom of FIG. 7B.

Finding the center of the detected intensity along an axis may be performed, for example, by fitting a second order polynomial to the detected segment data. One such example fitting is shown in the graph at the top of FIG. 7B. The center position for that axis may then be found by solving the equation where the derivative of that second order polynomial is zero. This gives the maximum point of the polynomial and hence is a good estimate of the center position along that axis.

Figure 8:
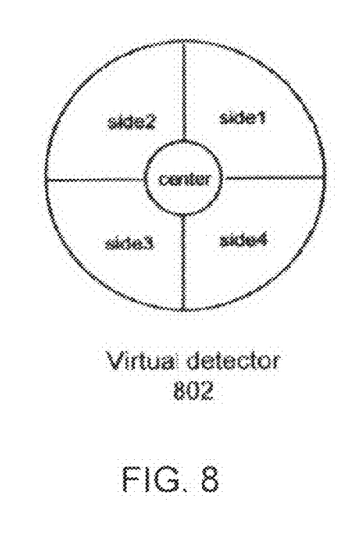
FIG. 8 depicts segments of an example virtual detector in accordance with an embodiment of the invention.

FIG. 8 depicts segments of an example virtual detector in accordance with an embodiment of the invention. Of course, the virtual detector may have various numbers of segments and segment shapes. This example virtual detector has a center segment and four side segments.

Figure 9:
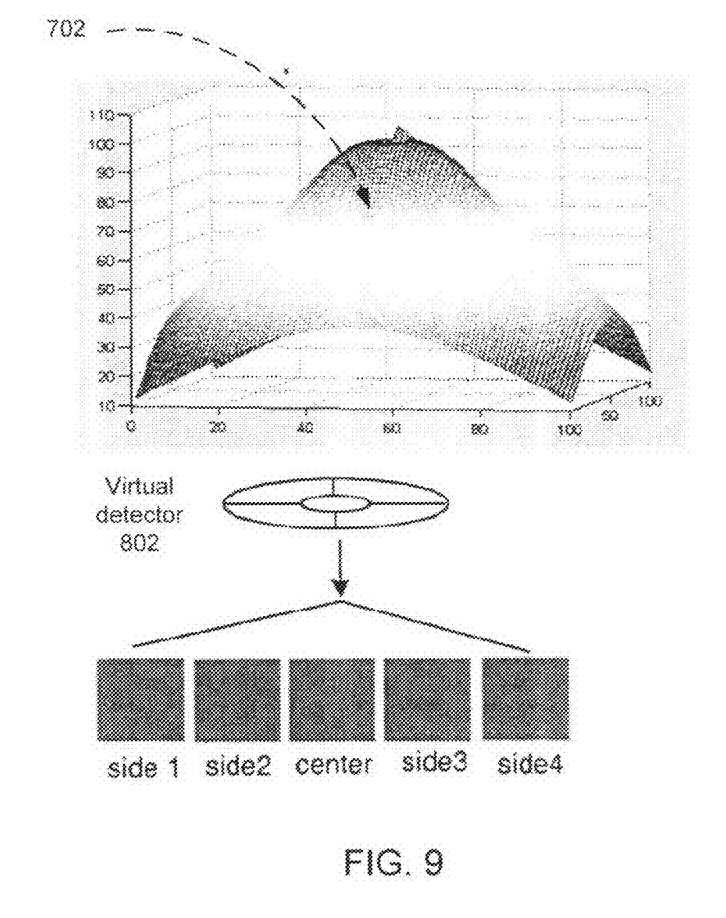
FIG. 9 is a schematic diagram depicting the steps of positioning the virtual detector under the electron cloud distribution and integrating the cloud over the segments of the virtual detector to generate bright and dark field images in accordance with an embodiment of the invention.

FIG. 9 is a schematic diagram depicting the steps of placing (positioning) the virtual detector 802 "under" the electron cloud distribution 702, and integrating the cloud over the segments of the virtual detector to generate bright and dark field images (shown here for the center and four side segments of the example virtual detector of FIG. 8). In accordance with the above discussion, these generated bright and dark field images have been dynamically compensated for movement of the secondary electron beam caused by scanning of the primary beam.

In alternate embodiments, instead of integrating the electron cloud distribution over the segments of the virtual detector, other similar calculations may be performed. For example, a mean (average) or median of the electron cloud distribution may be calculated or determined over the segments of the virtual detector. Thereafter, the mean or median values may be used to generate the bright and dark field images which have been dynamically compensated for movement of the secondary electron beam caused by scanning of the primary beam.

Figure 10:
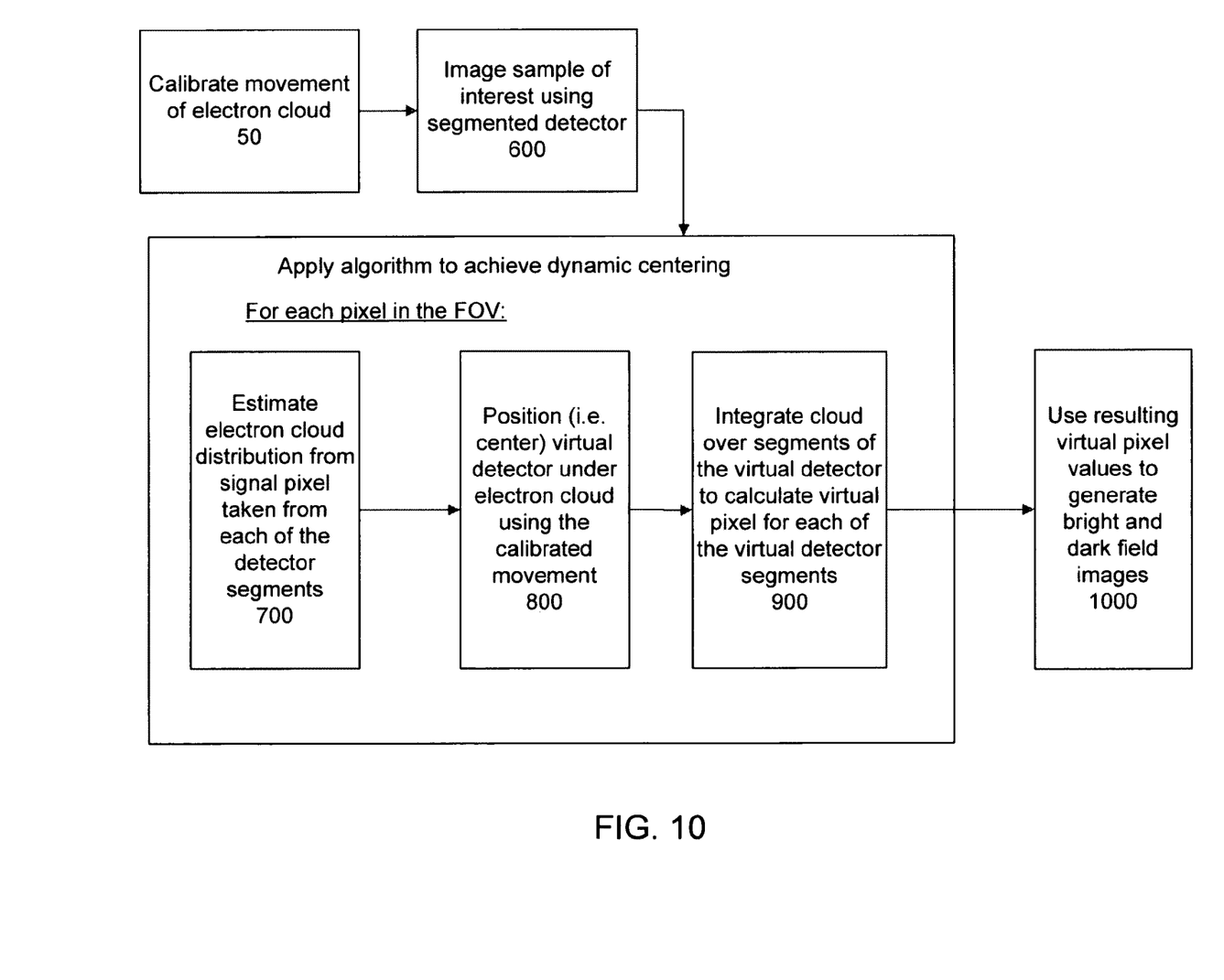
FIG. 10 is a flow chart depicting a method of dynamic centering for behind-the-lens dark field SEM imaging in accordance with an embodiment of the invention.

FIG. 10 is a flow chart depicting a method of dynamic centering for behind-the-lens darkfield SEM imaging in accordance with an embodiment of the invention. As shown in FIG. 10, a preliminary step 50 involves calibrating movement of the electron cloud. This calibration step is discussed further below in relation to FIG. 12. The next illustrated step 600 involves imaging the sample of interest using a segmented detector. This step 600 is discussed above, for example, in relation to FIG. 6. This step provides, for each pixel in the field of view, a "signal" pixel from each detector segment. For example, if there are nine detector segments, this step provides data for nine images of the field of view, one image per segment.

Thereafter, a dynamic centering algorithm (procedure) is applied. In accordance with an embodiment of the invention, for each pixel in the field of view, the following steps may be performed. For example, if the field of view is 300×300=90,000 pixels, then this algorithm would be applied for each of the 90,000 pixels in the field of view.

In a first step 700 the electron cloud distribution (including the center position of the distribution) is estimated from the signal pixel (i.e. pixel value) taken from each of the (actual or physical) detector segments. For example, if there are nine detector segments, then the nine pixel values would be used to estimate the electron cloud distribution. This step is discussed further above in relation to FIGS. 7A and 7B.

In a next step 800, a virtual detector is positioned "under" the estimated electron cloud distribution. This step is further discussed above in relation to FIG. 9. This step may be thought of as being performed in lieu of the impractical alternative of physically moving the actual detector (as discussed above in relation to FIG. 5). The calibrated movement of the electron cloud, as previously determined in the calibration step 50, provides the relative lateral (x-y) location of the virtual detector to the estimated electron cloud distribution.

In a following step 900, the electron cloud distribution is integrated over the areas of the segments of the virtual detector. This step is further discussed above in relation to FIG. 9. The calculation of this step provides a virtual pixel value for each of the segments of the virtual detector. For example, if the virtual detector has five segments, then this step calculates five pixel values, one for each virtual detector segment.

The above-discussed steps 700, 800, and 900 are performed for each pixel in the field of view.

Finally, per block 1000, the resulting pixel values from the segments of the virtual detector are used to generate the bright and dark field images. The resulting bright and dark field images are compensated for movement of the secondary electron beam due to the scanning movement of the primary beam.

Figure 11:
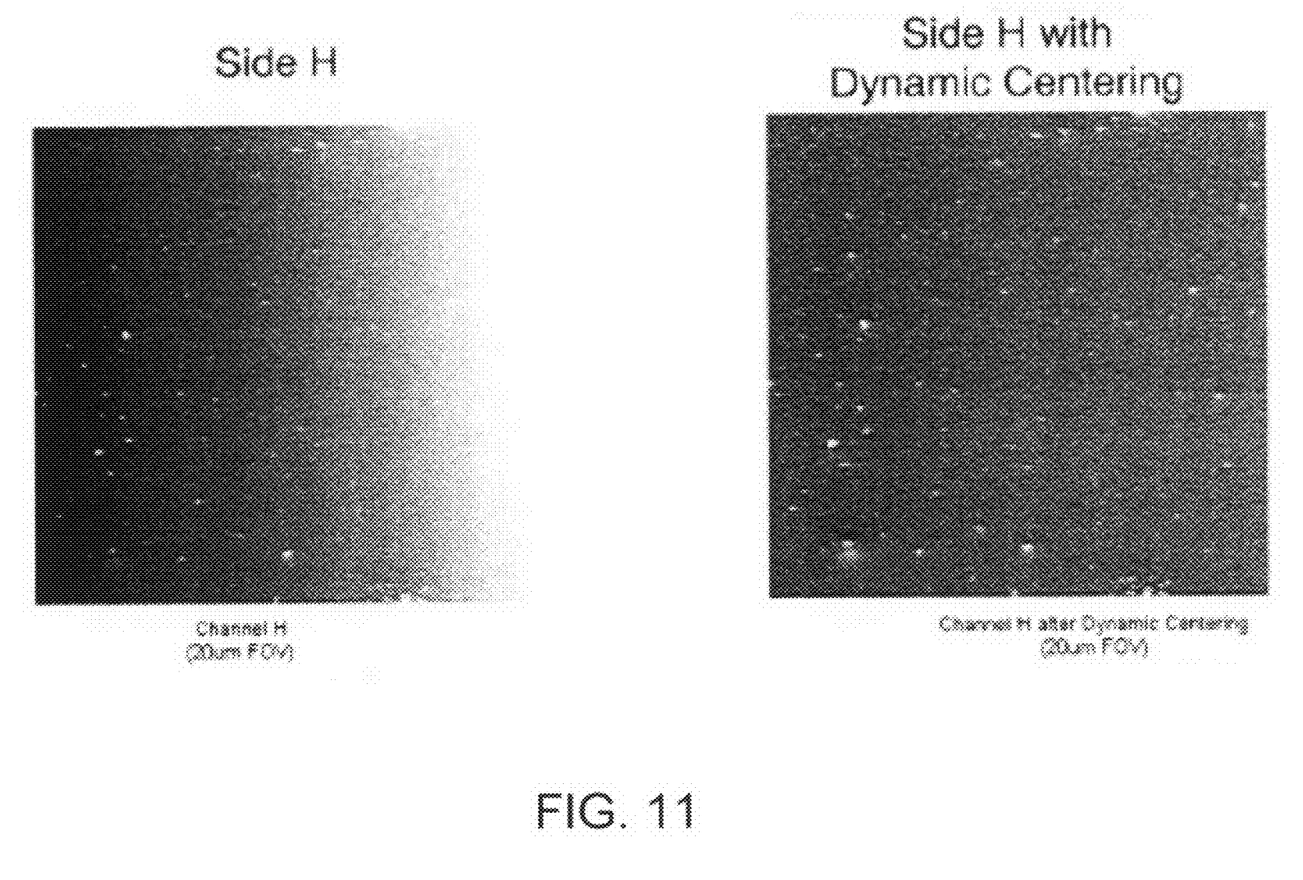
FIG. 11 shows two electron micrographs (images) showing an advantageous result of the technique disclosed herein in accordance with an embodiment of the invention.

FIG. 11 shows two electron micrographs showing an advantageous result of the technique disclosed herein in accordance with an embodiment of the invention. The electron micrograph on the left shows an image generated from one channel (Side H of the MA detector 502). This image has not been compensated for movement of the secondary electron beam due to the scanning movement of the primary beam. As seen, the area on the right side of this image appears to be much more brightly illuminated.

On the other hand, the electron micrograph on the right shows the image after being compensated for movement of the secondary electron beam due to the scanning movement of the primary beam in accordance with an embodiment of the invention. As seen, this image appears much more even in the intensity distribution. The artifact of having one portion of the image much brighter than other portions is no longer present. This is because of the advantageous application of the dynamic centering technique discussed herein.

Figure 12:
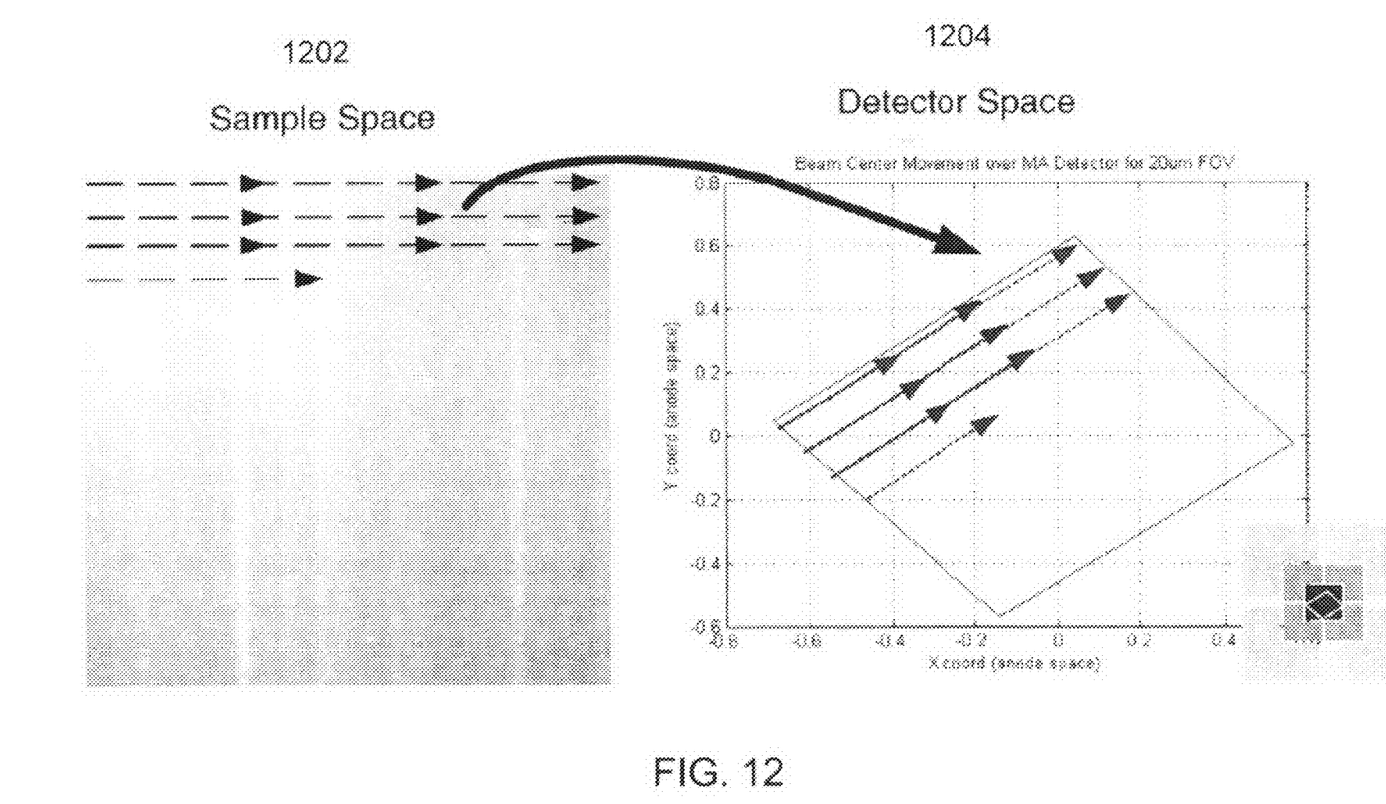
FIG. 12 is a schematic diagram illustrating a technique for calibrating the movement of the electron cloud distribution of a secondary electron beam in accordance with an embodiment of the invention.

In accordance to an embodiment of the invention, the calibration technique for step 50 in FIG. 10 may involve the following steps. First, a featureless sample may be imaged using the system. An image would be taken for each of the nine (for example) segments of the multi-segment detector. Next, a center of the estimated electron cloud distribution may be calculated for the four corners of the images. For each corner, a curve may be fit to the pixel values from each of the nine segments. Thereafter, the movement of the center of the electron cloud distribution may be determined assuming that the secondary electron beam moves linearly between those four corner points. FIG. 12 is a schematic diagram illustrating this technique for calibrating the movement of the electron cloud distribution. The diagram shows the mapping from "sample space" (i.e. the scanned pixel positions in the field of view) to the "detector space" (i.e. the corresponding centers of the electron cloud at the behind-the-lens detector). As seen in the figure, as the primary beam rasters from left-to-right in sample space, the center of the electron cloud moves in a corresponding manner within a parallelogram in detector space.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. A method of behind-the-lens dark-field imaging using a scanning electron microscope apparatus, the method comprising:

focusing an incident electron beam onto a specimen surface using an immersion objective lens;

deflecting the incident electron beam so as to scan the incident electron beam over a field of view of the specimen surface;

detecting a secondary electron beam using a segmented detector to obtain a set of pixel data for each segment of the detector;

compensating for scan-dependent movement of the secondary electron beam over the segmented detector by processing using a dynamic centering algorithm to generate a set of virtual pixel data for each segment of a virtual detector; and using at least one set of the virtual pixel data to generate a dark field image.

2. The method of claim 1, further comprising:

performing a calibration to determine a movement of the electron distribution in relation to the segmented detector.

3. The method of claim 2, wherein the movement of the electron distribution in relation to the segmented detector depends upon electron imaging conditions, including at least a landing energy of the incident electron beam and an extraction field.

4. The method of claim 1, wherein the dynamic centering algorithm comprises estimating an electron distribution for the secondary electron beam.

5. The method of claim 4, wherein the dynamic centering algorithm further comprises positioning a virtual segmented detector in relation to the electron distribution.

6. The method of claim 5, wherein the dynamic centering algorithm further comprises using a calibrated movement of the electron distribution to determine said positioning of the virtual segmented detector in relation to the electron distribution.

7. The method of claim 6, wherein the dynamic centering algorithm further comprises integrating or determining a mean or median of the electron distribution over segments of the virtual detector to calculate a virtual pixel value for each segment of the virtual detector.

8. A method of compensating for scan-dependent movement of a secondary electron beam over a segmented detector, the method comprising:

estimating an electron distribution for the secondary electron beam;

using a calibrated movement of the electron distribution to determine positioning of a virtual segmented detector in relation to the electron distribution; and integrating or determining a mean or median of the electron distribution over segments of the virtual detector to calculate a virtual pixel value for each segment of the virtual detector using the virtual pixel value for each segment of the virtual segmented detector to compensate for scan-dependent movement of the secondary electron beam detected by the segmented detector.

9. The method of claim 8, wherein the method is used for dark field imaging with a scanning electron microscope.

10. A scanning electron beam apparatus with behind-the-lens dark-field imaging, the apparatus comprising:

an immersion objective lens configured to focus the incident electron beam onto a specimen surface;

a beam deflector configured to controllably scan an incident electron beam over a field of view of the specimen surface;

a segmented detector configured behind the objective lens and further configured detect a secondary electron beam emitted from the specimen surface such that a set of pixel data is obtained from each segment of the detector; and a data processing system configured to compensate for scan-dependent movement of the secondary electron beam over the segmented detector by processing using a dynamic centering algorithm to generate a set of virtual pixel data for each segment of a virtual detector and further configured to generate a dark field image using at least one set of the virtual pixel data.

11. The apparatus of claim 10, wherein the dynamic centering algorithm comprises estimating an electron distribution for the secondary electron beam.

12. The apparatus of claim 11, wherein the dynamic centering algorithm further comprises positioning a virtual segmented detector in relation to the electron distribution.

13. The apparatus of claim 12, wherein the dynamic centering algorithm further comprises using a calibrated movement of the electron distribution to determine said positioning of the virtual segmented detector in relation to the electron distribution.

14. The apparatus of claim 13, wherein the dynamic centering algorithm further comprises integrating the electron distribution over segments of the virtual detector to calculate a virtual pixel value for each segment of the virtual detector.

* * * * *